(12) United States Patent
Helm et al.

(10) Patent No.: US 9,947,418 B2
(45) Date of Patent: Apr. 17, 2018

(54) BOOSTED CHANNEL PROGRAMMING OF MEMORY

(71) Applicant: MICRON TECHNOLOGY, INC., Boise, ID (US)

(72) Inventors: Mark A. Helm, Santa Cruz, CA (US); Kalyan C. Kavalipurapu, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/096,439

(22) Filed: Apr. 12, 2016

(65) Prior Publication Data
US 2017/0294233 A1  Oct. 12, 2017

(51) Int. Cl.
*G11C 16/10*  (2006.01)
*G11C 16/34*  (2006.01)

(52) U.S. Cl.
CPC .......... *G11C 16/3459* (2013.01); *G11C 16/10* (2013.01)

(58) Field of Classification Search
CPC .............................. G11C 16/10; G11C 16/3459
See application file for complete search history.

(56) References Cited

U.S. PATENT DOCUMENTS

| | | | | |
|---|---|---|---|---|
| 6,469,933 B2* | 10/2002 | Choi | .................. | G11C 16/3427 |
| | | | | 365/185.17 |
| 6,804,150 B2* | 10/2004 | Park | ...................... | G11C 16/12 |
| | | | | 365/185.02 |
| 7,269,068 B2* | 9/2007 | Chae | ...................... | G11C 16/10 |
| | | | | 365/185.17 |
| 7,286,408 B1* | 10/2007 | Higashitani | ........ | G11C 16/3427 |
| | | | | 365/185.18 |
| 7,349,263 B2 | 3/2008 | Kim et al. | | |
| 7,656,703 B2* | 2/2010 | Dong | .................. | G11C 16/0483 |
| | | | | 365/185.02 |
| 2008/0117684 A1* | 5/2008 | Hemink | .............. | G11C 11/5628 |
| | | | | 365/185.19 |
| 2012/0044768 A1 | 2/2012 | Jones | | |
| 2015/0043275 A1* | 2/2015 | Srinivasan | ......... | G11C 16/3459 |
| | | | | 365/185.03 |
| 2016/0019949 A1 | 1/2016 | Raghunathan et al. | | |

* cited by examiner

*Primary Examiner* — Douglas King
(74) *Attorney, Agent, or Firm* — Dicke, Billig & Czaja, PLLC

(57) ABSTRACT

Methods of operating a memory include generating a programming pulse for a programming operation having a plurality of steps prior to a program voltage level of the programming pulse, and generating a subsequent programming pulse for the programming operation having the plurality of steps prior to a program voltage level of the subsequent programming pulse, wherein a particular step of the plurality of steps of the programming pulse has a different magnitude than a corresponding step of the plurality of steps of the subsequent programming pulse.

25 Claims, 8 Drawing Sheets

BOOSTED CHANNEL PROGRAMMING OF MEMORY

TECHNICAL FIELD

The present disclosure relates generally to memory and, in particular, in one or more embodiments, the present disclosure relates to boosted channel programming of memory.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory include personal computers, personal digital assistants (PDAs), digital cameras, digital media players, cellular telephones, solid state drives and removable memory modules, and the uses are growing.

Memory cells may be configured to operate as what are known in the art as single-level memory cells (SLC) or multi-level memory cells (MLC). SLC and MLC memory cells assign a data state (e.g., representing a respective value of one or more bits) to a specific range of threshold voltages (Vt) stored on the memory cells. Single level memory cells permit the storage of a single binary digit (e.g., bit) of data on each memory cell. Meanwhile, MLC technology permits the storage of more than one binary digit per memory cell (e.g., two bits, three bits, four bits, etc.), depending on the quantity of threshold voltage ranges assigned to the memory cell and the stability of the assigned threshold voltage ranges during the lifetime operation of the memory cell. By way of example, one bit (e.g., 1 or 0) may be represented by two threshold voltage ranges, two bits by four ranges, three bits by eight ranges, etc. Non-binary numbers of threshold voltage ranges are also known, e.g., using two memory cells configured to operate with three data states to collectively store three bits of information, or 1.5 bits per memory cell. As a single memory cell is used to store higher levels of data, differentiating data states can become more difficult.

Programming in memories is typically accomplished by applying a plurality of programming pulses, separated by verify pulses, to program each memory cell of a selected group of memory cells to a respective intended data state (which may be an interim or final data state). With such a scheme, the programming pulses are applied to access lines, such as those typically referred to as word lines, for selected memory cells. After each programming pulse, one or more verify pulses are used to verify the programming of the selected memory cells. Current programming typically uses many programming pulses in an incremental step pulse programming scheme, where each programming pulse is a single pulse that moves the memory cell threshold voltage by some amount. Programming operations are generally power intensive operations of a memory device.

For the reasons stated above, and for other reasons stated below which will become apparent to those skilled in the art upon reading and understanding the present specification, there is a need in the art for alternative methods of programming memory, and apparatus to perform such methods.

DETAILED DESCRIPTION

Figure 1:
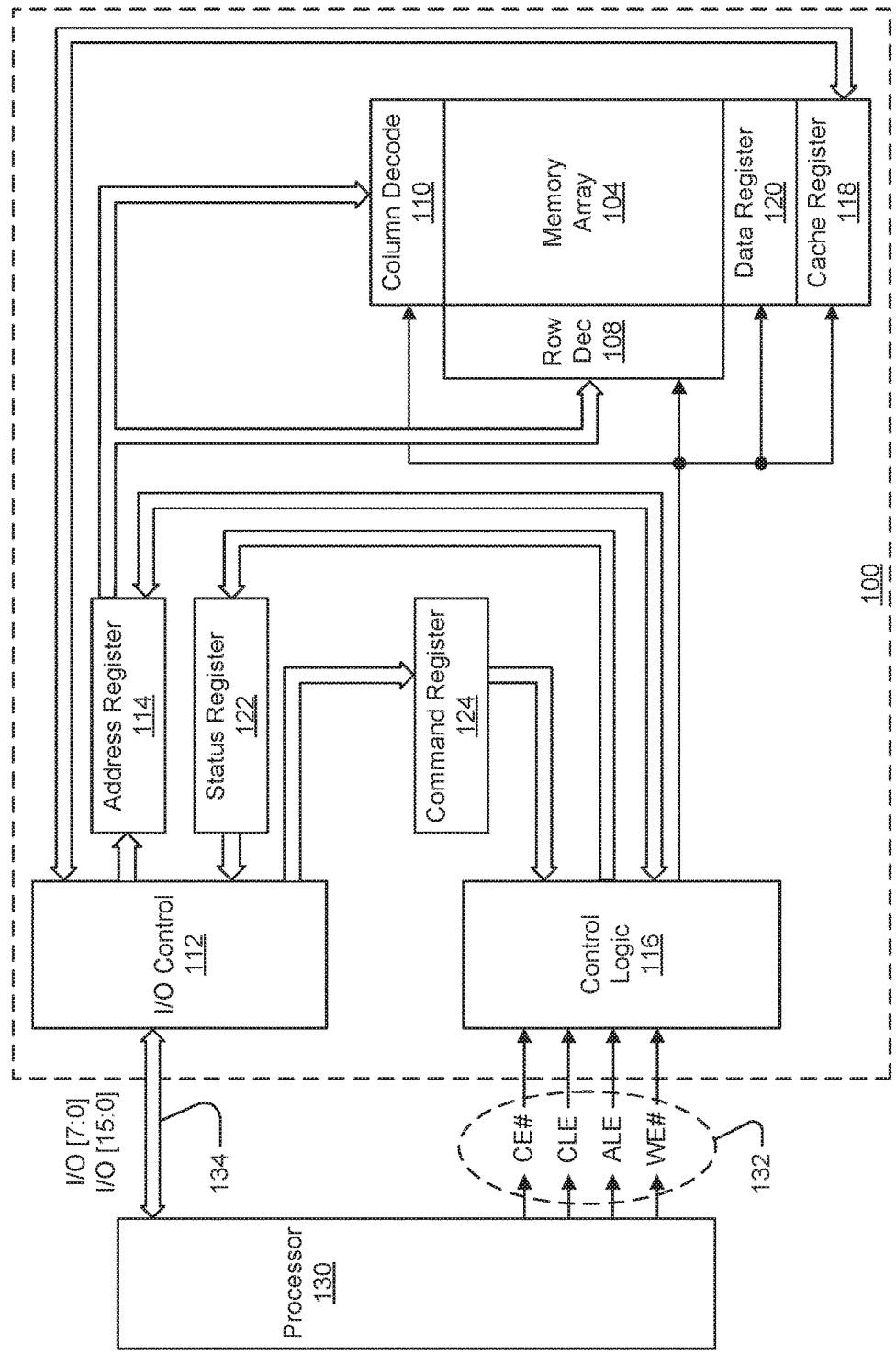
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least three data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations (e.g., programming operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
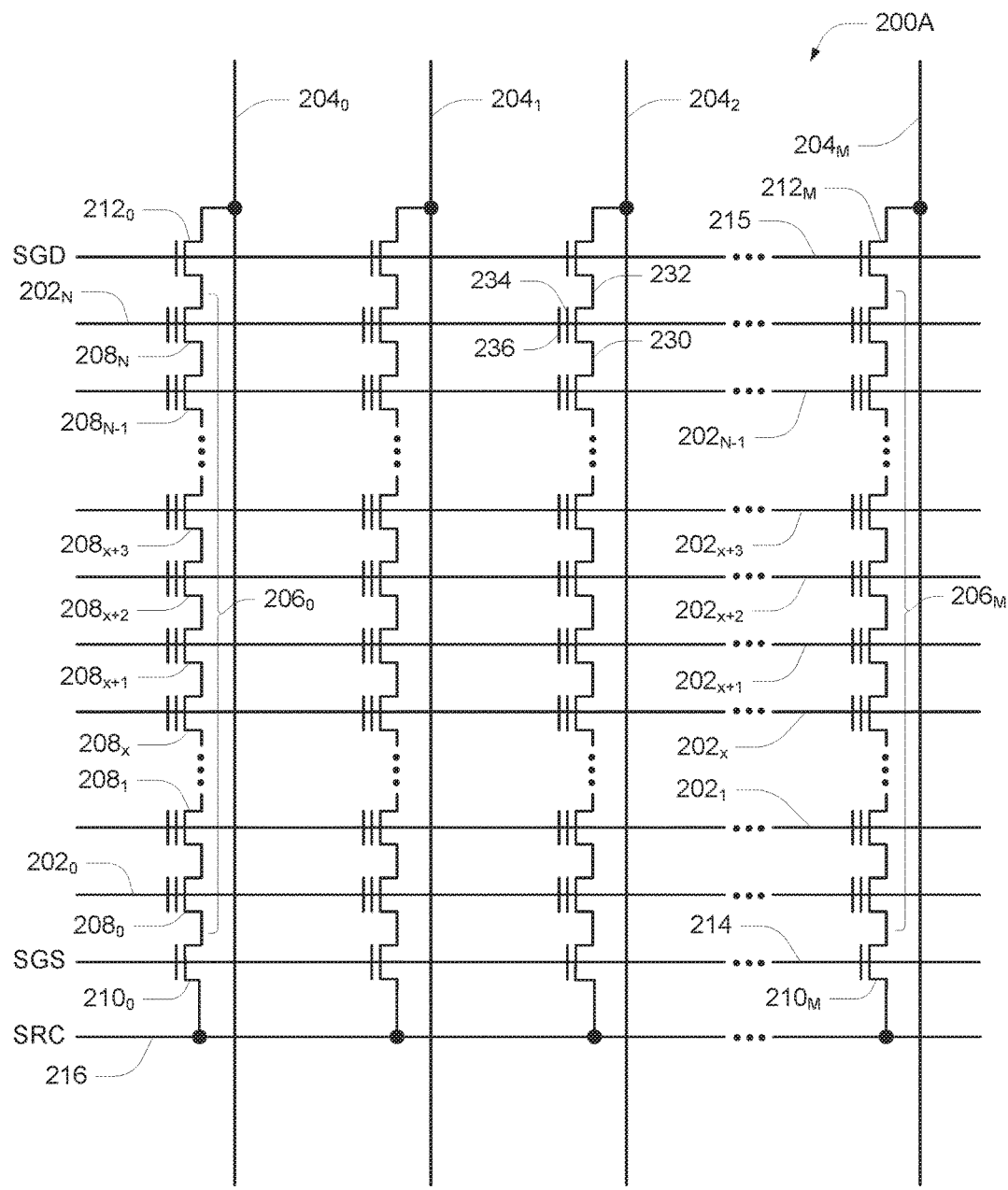
FIG. 2A is a schematic of a portion of an array of memory cells as could be used in a memory of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly connected to a select line 214, such as a source select line, and select transistors $212_0$ to $212_M$ might be commonly connected to a select line 215, such as a drain select line.

A source of each select transistor 210 might be connected to common source 216. The drain of each select transistor 210 might be connected to a memory cell $208_0$ of the corresponding NAND string 206. For example, the drain of select transistor $210_0$ might be connected to memory cell $208_0$ of the corresponding NAND string $206_0$. Therefore, each select transistor 210 might be configured to selectively connect a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to a memory cell $208_N$ of the corresponding NAND string 206. For example, the source of select transistor $212_0$ might be connected to memory cell $208_N$ of the corresponding NAND string $206_0$. Therefore, each select transistor 212 might be configured to selectively connect a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. In some cases, memory cells 208 may further have a defined source 230 and a defined drain 232. Memory cells 208 have their control gates 236 connected to (and in some cases form) a word line 202.

A column of the memory cells 208 is a NAND string 206 or a plurality of NAND strings 206 selectively connected to a given bit line 204. A row of the memory cells 208 may be memory cells 208 commonly connected to a given word line 202. A row of memory cells 208 can, but need not include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page. The portion of a physical page (which, in some embodiments, could still be the entire row) that is read during a single read operation or programmed during a programming operation (e.g., an upper or lower page memory cells) might be deemed a logical page. A block of memory cells may include those memory cells that are configured to be erased together, such as all memory cells connected to word lines $202_0$-$202_N$ (e.g., all NAND strings 206 sharing common word lines 202).

Figure 2B:
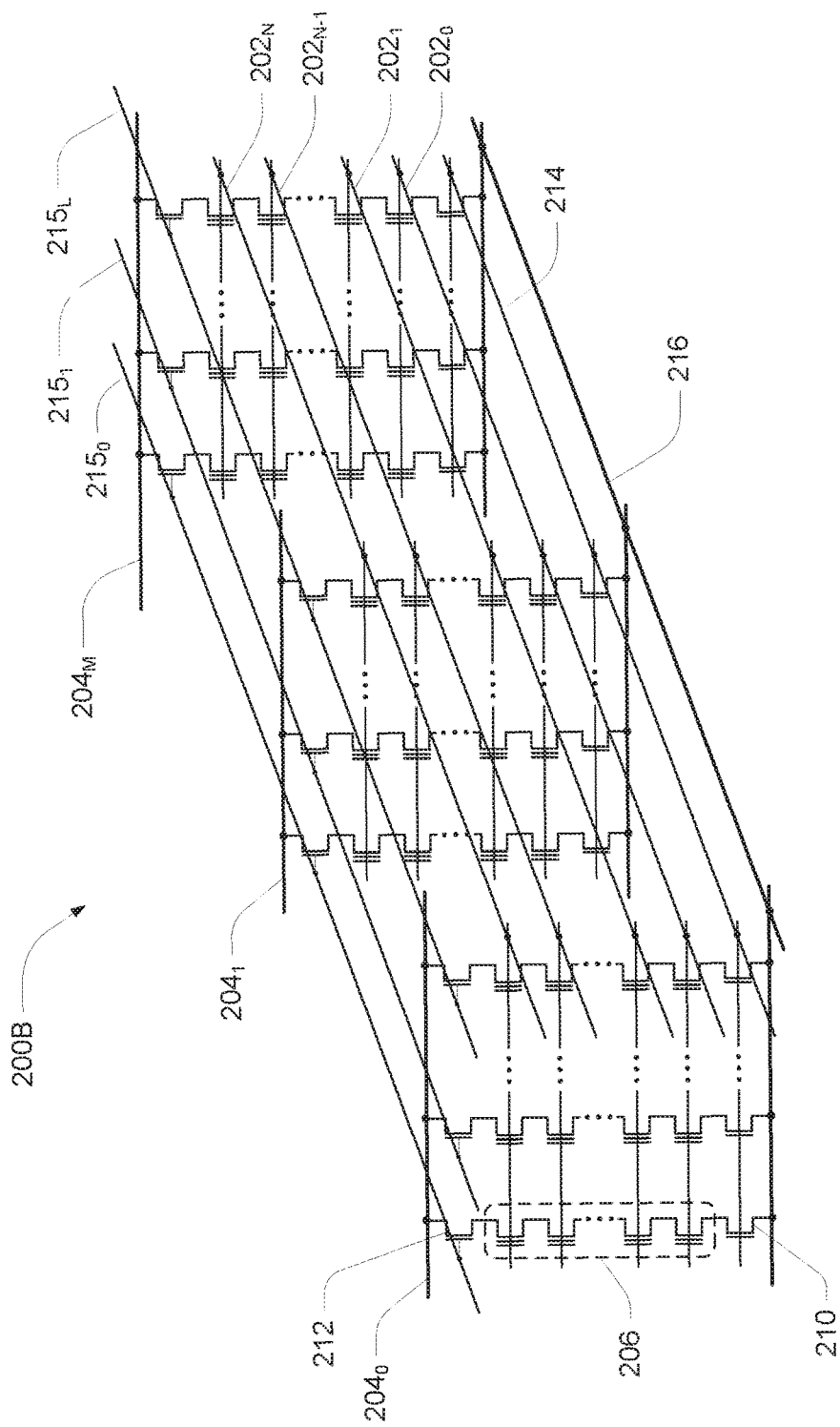
FIG. 2B is another schematic of a portion of an array of memory cells as could be used in a memory of the type described with reference to FIG. 1.

FIG. 2B is another schematic of a portion of an array of memory cells as could be used in a memory of the type described with reference to FIG. 1. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214.

Each word line 202 may be connected to multiple rows of memory cells of the memory array 200B. Rows of memory cells that are commonly connected to each other by a particular word line 202 may collectively be referred to as tiers. Structures of memory cells may be similar in components to those described with reference to FIG. 2A, although they may possess a different geometry.

Although the examples of FIGS. 2A and 2B are discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
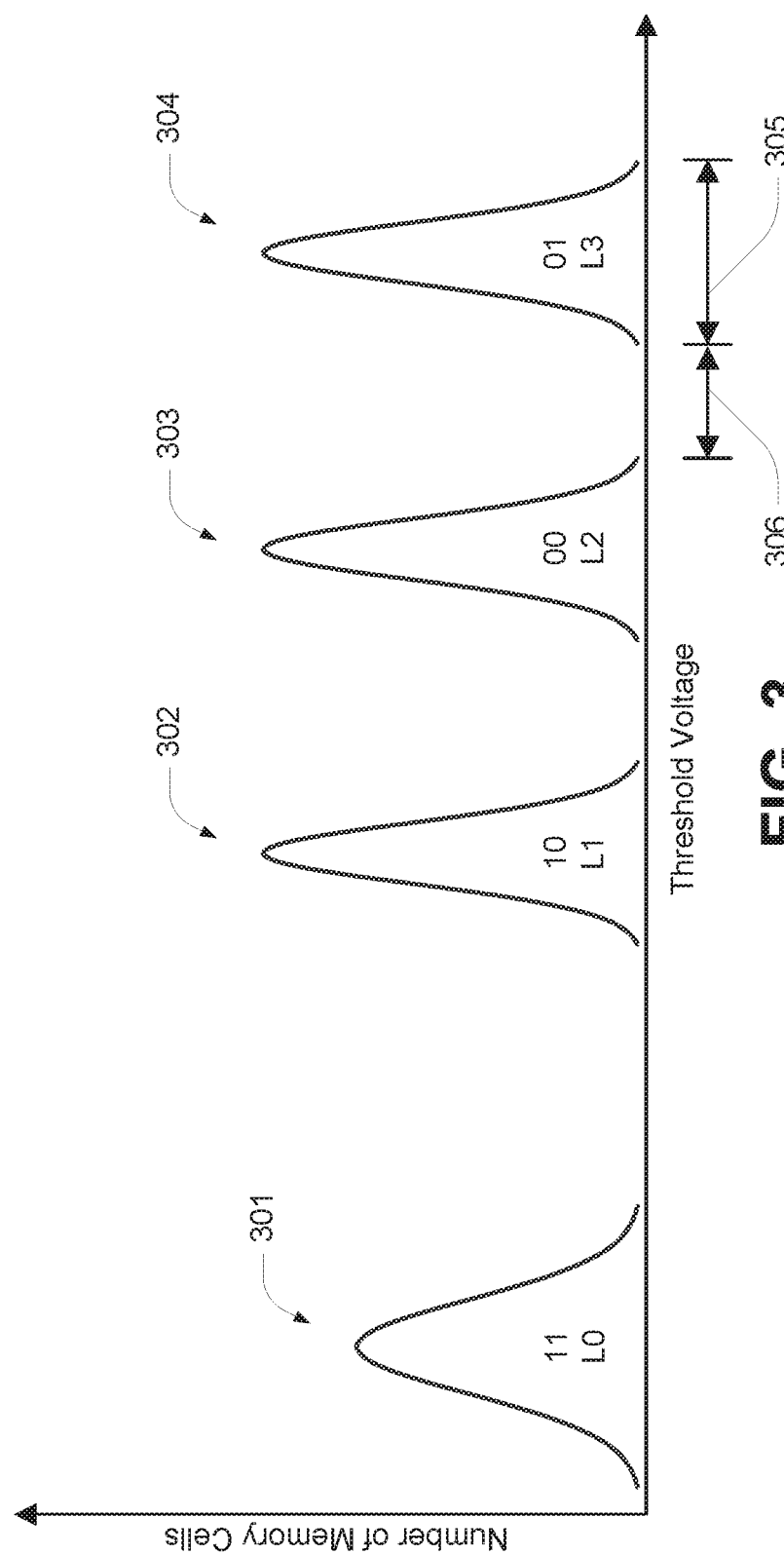
FIG. 3 illustrates an example of threshold voltage ranges for a population of multi-level memory cells.

FIG. 3 illustrates an example of threshold voltage ranges for a population of a four-level (e.g., two bits per memory cell) MLC memory cells. For example, such a memory cell might be programmed to a threshold voltage (Vt) that falls within one of four different threshold voltage ranges 301-304, each being used to represent a data state corresponding to a bit pattern comprised of two bits. The threshold voltage range 301 typically has a greater width than the remaining threshold voltage ranges 302-304 as memory cells are generally all placed in the data state corresponding to the threshold voltage range 301, e.g., in response to an erase operation, then subsets of those memory cells are subsequently programmed to have threshold voltages in one of the threshold voltage ranges 302-304. As programming operations are generally more incrementally controlled than erase operations, these threshold voltage ranges 302-304 may tend to have tighter distributions.

The threshold voltage ranges 302-304 might each have a width 305, e.g., a width of 750 mV. In addition, a dead space 306 (e.g., sometimes referred to as a margin, and might be approximately 500 mV or greater) is typically maintained between adjacent threshold voltage ranges 301-304 to keep the threshold voltage ranges from overlapping. As an example, if the threshold voltage of a memory cell is within the first of the four threshold voltage ranges 301, the memory cell in this case is storing a logical '11' or level 0 (L0) data state and is typically referred to as the erased state of the memory cell. If the threshold voltage is within the second of the four threshold voltage ranges 302, the memory cell in this case is storing a logical '10' or level 1 (L1) data state. A threshold voltage in the third threshold voltage range 303 would indicate that the memory cell in this case is storing a logical '00' or level 2 (L2) data state. Finally, a threshold voltage residing in the fourth threshold voltage range 304 indicates that a logical '01' or level 3 (L3) data state is stored in the memory cell.

Schemes for programming memory cells to more than two data states include boosted channel programming (BCP), where some memory cells might be enabled for programming, some memory cells might be partially enabled for (e.g., partially inhibited from) programming, and some memory cells might be inhibited (e.g., fully inhibited) from programming. In effect, BCP utilizes the concept of program disturb to program memory cells to intermediate intended data states (e.g., data states between an upper data state and a lower data state) in a multi-level memory, such as described with reference to FIG. 3, while other selected memory cells are programmed to an upper (e.g., a highest) intended data state by boosting channel voltages of memory cells corresponding to the intermediate intended data states to slow, but not fully inhibit, programming of those memory cells.

Figure 4:
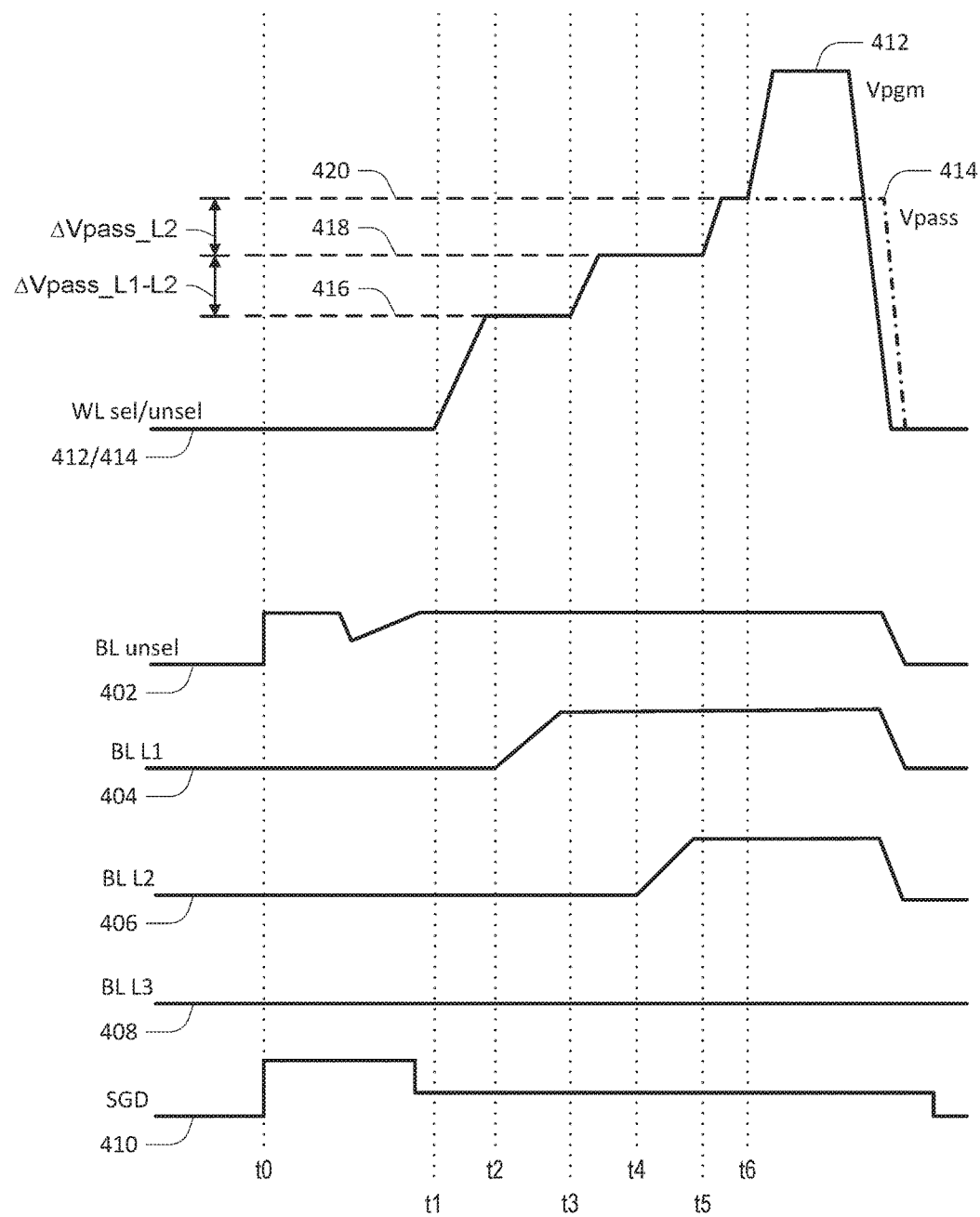
FIG. 4 illustrates a timing diagram for a programming pulse of a typical BCP programming operation for a four-level memory device.

A timing diagram for a programming pulse of a typical BCP programming operation for a four-level (e.g., two bits per memory cell) memory device is depicted in FIG. 4. The process will be described with reference to an array architecture of the types depicted in FIG. 2A or 2B and with reference to data states such as depicted in FIG. 3. The process will generally refer to a selected access line (e.g., selected word line) that is connected to one or more memory cells selected for programming and an unselected access line (e.g., unselected word line) that is connected to one or more memory cells not selected for programming. Voltage levels applied to the selected access line (WL sel) are represented by trace 412 while voltage levels applied to the unselected access line (WL unsel) are represented by trace 414. Although only one unselected access line is discussed with reference to FIG. 4, each unselected access line of a NAND string 206 (e.g., each access line 202 of the NAND string 206 other than the selected access line 202) may receive the same voltage levels, although other schemes may also be used.

The process of FIG. 4 will also generally refer to selected data lines (e.g., selected bit lines) each connected to a memory cell selected for programming to one of the L1, L2 or L3 data states, and unselected data lines (e.g., unselected bit lines) that are selectively connected to memory cells connected to the selected access line that are either to remain in the L0 data state or have already reached their intended L1, L2 or L3 data state. Voltage levels applied to the selected data lines (BL L1, BL L2 and BL L3) are represented by traces 404, 406 and 408, respectively, while voltage levels applied to the unselected data line (BL unsel) are represented by trace 402. The voltage levels applied to the select gate drain (SGD) are represented by trace 410. The reference numerals of the traces will be used also to refer to the node to which its voltage levels are applied.

At time t0, the voltage level applied to BL unsel 402 is raised to an inhibit voltage (e.g., Vcc). In conjunction, SGD 410 is raised to a voltage level sufficient to activate the corresponding select gates to pass the voltage level of BL unsel 402 to the channels of the corresponding NAND strings connected to the selected access line WL sel 412. SGD 410 is subsequently (e.g., before time t1) reduced to a voltage level sufficient to activate select gates connected to bit lines to which a reference voltage (e.g., Vss or ground) is applied and to deactivate select gates connected to bit lines to which the inhibit voltage is applied. Time t1 occurs after BL unsel 402 is allowed to return to the inhibit voltage. The voltage level applied to BL L3 408 might remain at the reference voltage through the various stages of the programming pulse.

At time t1, the voltage level applied to both WL sel 412 and WL unsel 414 is raised to a level 416, boosting the channel voltage (Vch) of the memory cells connected to the selected access line that are to remain at the L0 data state or have already reached their intended L1, L2 or L3 data state after a prior programming pulse. The voltage level increase (e.g., step) to level 416 may be referred to as ΔVpass_L0-L1. At time t2 (e.g., after WL sel 412 and WL unsel 414 have reached the level 416), BL L1 404 is raised to the inhibit voltage.

At time t3 (e.g., after BL L1 404 has reached the inhibit voltage), the voltage level applied to both WL sel 412 and WL unsel 414 is raised to a level 418, further boosting the channel voltage (Vch) of the memory cells that are to remain at the L0 data state or have already reached their intended L1, L2 or L3 data state after a prior programming pulse, and boosting the channel voltage (Vch) of the memory cells that are to be programmed to the L1 data state. The voltage level increase (e.g., step) to level 418 from level 416 may be referred to as ΔVpass_L1-L2. At time t4 (e.g., after WL sel 412 and WL unsel 414 have reached the level 418), BL L2 406 is raised to the inhibit voltage.

At time t5 (e.g., after BL L2 406 has reached the inhibit voltage), the voltage level applied to both WL sel 412 and WL unsel 414 is raised to a level 420, further boosting the channel voltage (Vch) of the memory cells that are to remain at the L0 data state or have already reached their intended L1, L2 or L3 data state after a prior programming pulse, further boosting the channel voltage (Vch) of the memory cells that are to be programmed to the L1 data state, and boosting the channel voltage (Vch) of the memory cells that are to be programmed to the L2 data state. The voltage level increase (e.g., step) to level 420 from level 418 may be referred to as ΔVpass_L2. At time t6 (e.g., after WL sel 412 and WL unsel 414 have reached the level 420), the voltage level applied to WL sel 412 is increased to the program voltage (Vpgm) while the voltage level applied to WL unsel 414 remains at the final pass voltage (Vpass) level 420. After WL sel 412 is held at the program voltage (Vpgm), e.g., for a time sufficient to produce an increase in threshold voltage of memory cells connected to the selected access line and selectively connected to data lines corresponding to BL L1 404, BL L2 406 and BL L3 408, the various nodes might be returned to some resting voltage level, e.g., the reference voltage.

Such BCP programming operations repeat this programming pulse and corresponding boosting until all memory cells connected to the selected access line and selected for programming to one of the L1, L2 or L3 data states have reached their intended data state, or a failure is declared. The levels 416, 418 and 420 to which the pass voltage (Vpass) is raised are chosen to boost the channel voltages of memory cells to be programmed to the L1 and L2 data states to voltages appropriate to allow their programming using program disturb at the same time memory cells to be programmed to the L3 data state are normally programmed. For example, consider where a target threshold voltage (e.g., a threshold voltage level for verification) of a memory cell programmed to the L3 data state is PV3, a target threshold voltage of a memory cell programmed to the L2 data state is PV2, and a target threshold voltage of a memory cell programmed to the L1 data state is PV1. In such a case, ΔVpass_L2 for each programming pulse might be PV3-PV2 while ΔVpass_L1-L2 for each programming pulse might be PV2-PV1, such that the channel voltage (Vch) of memory cells selected for programming to the L2 data state might be raised by a voltage level corresponding to (e.g., equal to)

PV3-PV2 while the channel voltage (Vch) of memory cells selected for programming to the L1 data state might be raised by a voltage level corresponding to (e.g., equal to) PV3-PV1. Memory cells not selected for programming (e.g., those memory cells connected to the selected access line and selectively connected to unselected data lines) might have their channel voltages (Vch) raised to a level intended to inhibit those memory cells from increasing their threshold voltages in response to the programming pulse having the program voltage (Vpgm).

Table 1 provides examples for various voltage levels used in, and resulting from, the BCP programming operation described with reference to FIG. 4. The example of Table 1 describes seven successive and increasing programming pulses, each programming pulse reaching a program voltage that is 0.5V higher than the program voltage of a preceding (e.g., immediately preceding) programming pulse. For each programming pulse, voltage levels for ΔVpass_L1-L2 and ΔVpass_L2 are the same at 2.0V, resulting in boosted channel voltages for memory cells to be programmed to the L1, L2 and L3 data states of 4.0V, 2.0V and 0V, respectively. As a result, the effective gate step, or the increase in the voltage level applied across the corresponding memory cells from one programming pulse to the next, is the same at 0.5V for each programmed data state.

TABLE 1

| Pulse # | Vpgm | ΔVpass L1-L2 | ΔVpass L2 | Vch L1 | Vch L2 | Vch L3 | Eff Gate Step L1 | Eff Gate Step L2 | Eff Gate Step L3 |
|---|---|---|---|---|---|---|---|---|---|
| 1 | 17.0 | 2.0 | 2.0 | 4.0 | 2.0 | 0 | | | |
| 2 | 17.5 | 2.0 | 2.0 | 4.0 | 2.0 | 0 | 0.5 | 0.5 | 0.5 |
| 3 | 18.0 | 2.0 | 2.0 | 4.0 | 2.0 | 0 | 0.5 | 0.5 | 0.5 |
| 4 | 18.5 | 2.0 | 2.0 | 4.0 | 2.0 | 0 | 0.5 | 0.5 | 0.5 |
| 5 | 19.0 | 2.0 | 2.0 | 4.0 | 2.0 | 0 | 0.5 | 0.5 | 0.5 |
| 6 | 19.5 | 2.0 | 2.0 | 4.0 | 2.0 | 0 | 0.5 | 0.5 | 0.5 |
| 7 | 20.0 | 2.0 | 2.0 | 4.0 | 2.0 | 0 | 0.5 | 0.5 | 0.5 |

Various embodiments facilitate improvements in read window budget (RWB) over a corresponding traditional BCP programming operation. The RWB can be generally thought of as the collective dead spaces 306 between each of the adjacent data states. Improving RWB can facilitate less problematic differentiation of data states, which may lead to a reduction in read errors. By reducing the effective gate step for an intermediate data state, its corresponding range of threshold voltages might be narrowed relative to the range of threshold voltages corresponding to the upper data state, thus increasing the RWB without hindering programming of memory cells to the upper data state.

Figure 5:
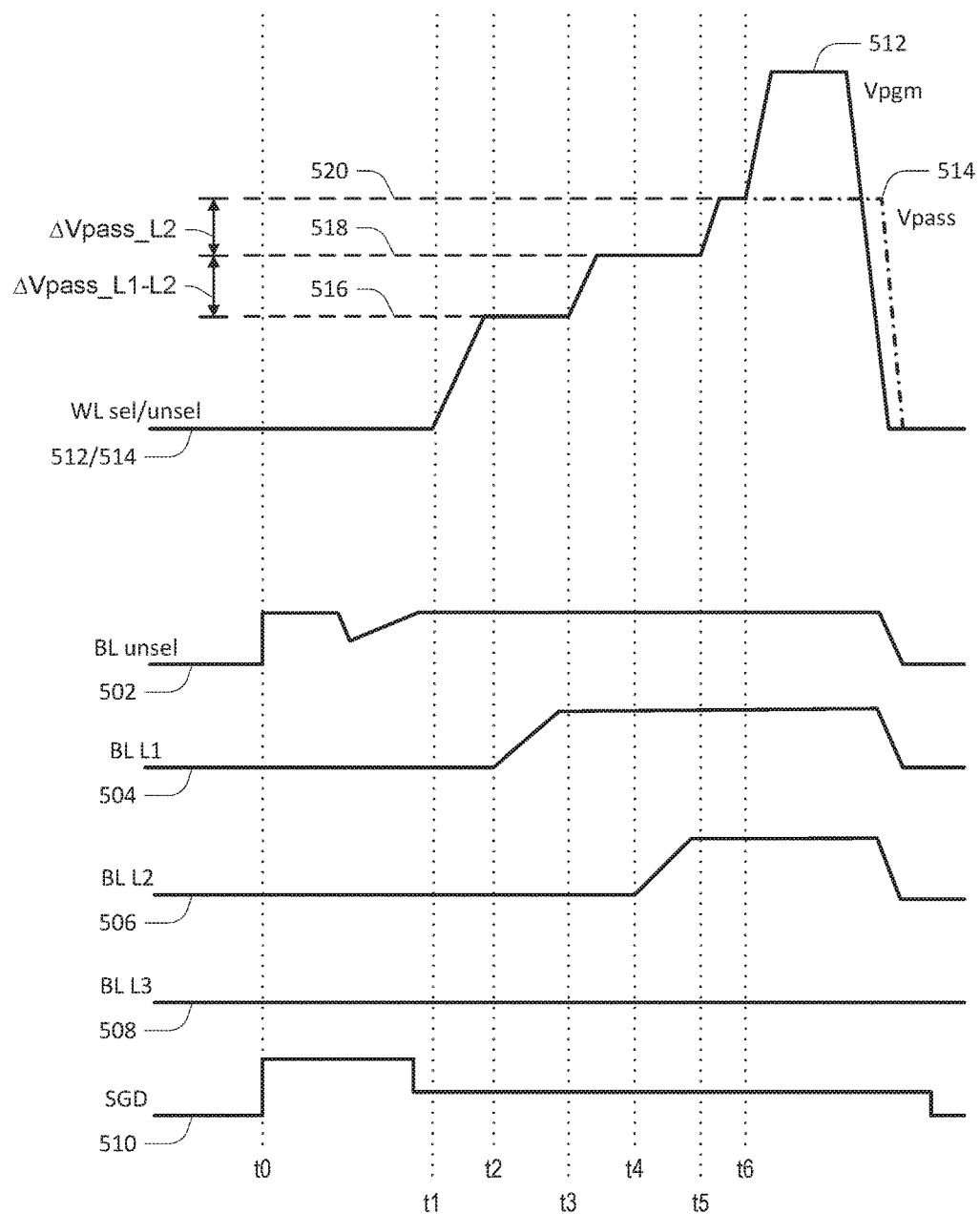
FIG. 5 illustrates a timing diagram for a programming pulse of a BCP programming operation for a four-level memory device in accordance with an embodiment.

A timing diagram for a programming pulse of a BCP programming operation for a four-level (e.g., two bits per memory cell) memory device in accordance with an embodiment is depicted in FIG. 5. The process will be described with reference to an array architecture of the types depicted in FIG. 2A or 2B and with reference to data states such as depicted in FIG. 3. The process will generally refer to a selected access line (e.g., selected word line) that is connected to one or more memory cells selected for programming during a particular programming operation and an unselected access line (e.g., unselected word line) that is connected to one or more memory cells not selected for programming during the particular programming operation. Voltage levels applied to the selected access line (WL sel) are represented by trace 512 while voltage levels applied to the unselected access line (WL unsel) are represented by trace 514. Although only one unselected access line is discussed with reference to FIG. 5, each unselected access line of a NAND string 206 (e.g., each access line 202 of the NAND string 206 other than the selected access line 202) may receive the same voltage levels. Other schemes may also be used, such as where unselected access lines between the selected access line and a selected data line have voltage levels sufficient to connect the channel of the selected memory cell to the selected data line while the selected data line is at the reference voltage and connected to the NAND string containing that memory cell.

The process of FIG. 5 will also generally refer to selected data lines (e.g., selected bit lines) each connected to a memory cell selected for programming to one of the L1, L2 or L3 data states, and unselected data lines (e.g., unselected bit lines) that are selectively connected to memory cells connected to the selected access line that are either to remain in the L0 data state or have already reached their intended L1, L2 or L3 data state. Voltage levels applied to the selected data lines (BL L1, BL L2 and BL L3) are represented by traces 504, 506 and 508, respectively, while voltage levels applied to the unselected data line (BL unsel) are represented by trace 502. The voltage levels applied to the select gate drain (SGD) are represented by trace 510. The reference numerals of the traces will be used also to refer to the node to which its voltage levels are applied.

At time t0, the voltage level applied to BL unsel 502 is raised to an inhibit voltage (e.g., Vcc). In conjunction, SGD 510 is raised to a voltage level sufficient to activate the corresponding select gates to pass the voltage level of BL unsel 502 to the channels of the corresponding NAND strings connected to the selected access line WL sel 512. SGD 510 is subsequently (e.g., before time t1) reduced to a voltage level sufficient to activate select gates connected to bit lines to which a reference voltage (e.g., Vss or ground) is applied and to deactivate select gates connected to bit lines to which the inhibit voltage is applied. Time t1 occurs after BL unsel 502 is allowed to return to the inhibit voltage. The voltage level applied to BL L3 508 might remain at the reference voltage through the various stages of the programming pulse.

At time t1, the voltage level applied to both WL sel 512 and WL unsel 514 is raised to a level 516, boosting the channel voltage (Vch) of the memory cells connected to the selected access line that are to remain at the L0 data state or have already reached their intended L1, L2 or L3 data state after a prior programming pulse. The voltage level increase (e.g., step) to level 516 may be referred to as ΔVpass_L0-L1. At time t2 (e.g., after WL sel 512 and WL unsel 514 have reached the level 516), BL L1 504 is raised to the inhibit voltage.

At time t3 (e.g., after BL L1 504 has reached the inhibit voltage), the voltage level applied to both WL sel 512 and WL unsel 514 is raised to a level 518, further boosting the channel voltage (Vch) of the memory cells that are to remain at the L0 data state or have already reached their intended L1, L2 or L3 data state after a prior programming pulse, and boosting the channel voltage (Vch) of the memory cells that are to be programmed to the L1 data state. The voltage level increase (e.g., step) to level 518 from level 516 may be referred to as ΔVpass_L1-L2. At time t4 (e.g., after WL sel 512 and WL unsel 514 have reached the level 518), BL L2 506 is raised to the inhibit voltage.

At time t5 (e.g., after BL L2 506 has reached the inhibit voltage), the voltage level applied to both WL sel 512 and WL unsel 514 is raised to a level 520, further boosting the channel voltage (Vch) of the memory cells that are to remain at the L0 data state or have already reached their intended L1, L2 or L3 data state after a prior programming pulse, further boosting the channel voltage (Vch) of the memory cells that are to be programmed to the L1 data state, and boosting the channel voltage (Vch) of the memory cells that are to be programmed to the L2 data state. The voltage level increase (e.g., step) to level 520 from level 518 may be referred to as ΔVpass_L2. At time t6 (e.g., after WL sel 512 and WL unsel 514 have reached the level 520), the voltage level applied to WL sel 512 is increased to the program voltage (Vpgm) while the voltage level applied to WL unsel 514 remains at the final pass voltage (Vpass) level 520. After WL sel 512 is held at the program voltage (Vpgm), e.g., for a time sufficient to produce an increase in threshold voltage of memory cells connected to the selected access line and selectively connected to data lines corresponding to BL L1 504, BL L2 506 and BL L3 508, the various nodes might be returned to some resting voltage level, e.g., the reference voltage.

The programming operation may repeat programming pulses and corresponding boosting until all memory cells connected to the selected access line and selected for programming to one of the L1, L2 or L3 data states have reached their intended data state, or a failure is declared. As with traditional BCP programming, the levels 516, 518 and 520 to which the pass voltage (Vpass) is raised on a programming pulse (e.g., an initial programming pulse) may be chosen to boost the channel voltages of memory cells to be programmed to the L1 and L2 data states to voltages appropriate to allow their programming using program disturb at the same time memory cells to be programmed to the L3 data state are normally programmed. As an example, initial values of ΔVpass_L1-L2 and/or ΔVpass_L2 might be chosen using the same criteria as traditional BCP programming. Similarly, memory cells not selected for programming (e.g., those memory cells connected to the selected access line and selectively connected to unselected data lines) might have their channel voltages (Vch) raised to a level intended to inhibit those memory cells from increasing their threshold voltages in response to the programming pulse having the program voltage (Vpgm).

In contrast to traditional BCP programming, a subsequent programming pulse in accordance with an embodiment may use different values of ΔVpass_L1-L2 and/or ΔVpass_L2 chosen such that the effective gate step, or the increase in the voltage level applied across (e.g., from control gate to channel) the corresponding memory cells from one programming pulse to the next, is less for memory cells to be programmed to the L1 and L2 data states (e.g., data states between the lower and upper data states) than for memory cells to be programmed to the L3 data state (e.g., the upper data state). For some embodiments, the values of ΔVpass_L1-L2 and/or ΔVpass_L2 may be chosen such that the effective gate step for memory cells to be programmed to the L1 data state is less than the effective gate step for memory cells to be programmed to the L2 data state, which is less than the effective gate step for memory cells to be programmed to the L3 data state. For some embodiments, the voltage level 520 may be the same for a subsequent (e.g., each subsequent) programming pulse, such that ΔVpass_L0-L1 might decrease to compensate for increases in ΔVpass_L1-L2 and/or ΔVpass_L2. For other embodiments, ΔVpass_L0-L1 may be the same for a subsequent (e.g., each subsequent) programming pulse, such that the voltage level 520 might increase in response to increases in ΔVpass_L1-L2 and/or ΔVpass_L2.

Table 2 provides examples for various voltage levels used in a programming operation of the type described with reference to FIG. 5 in accordance with an embodiment. The example of Table 2 describes seven successive and increasing programming pulses, each programming pulse reaching a program voltage that is 0.5V higher than the program voltage of a preceding (e.g., immediately preceding) programming pulse. For programming pulse #1 (e.g., an initial programming pulse), voltage levels for ΔVpass_L1-L2 and ΔVpass_L2 may be the same at 2.0V, resulting in boosted channel voltages for memory cells to be programmed to the L1, L2 and L3 data states of 4.0V, 2.0V and 0V, respectively.

For the embodiment of Table 2, subsequent values for ΔVpass_L1-L2 and ΔVpass_L2 might increase relative to a preceding (e.g., immediately preceding) programming pulse, providing increasing magnitudes of these steps of the programming pulse. For example, subsequent values for ΔVpass_L1-L2 and ΔVpass_L2 might increase by some particular amount, e.g., 0.1V, for each programming pulse as shown in Table 2, thus boosting the channel voltages for memory cells selected for programming to the L1 and L2 data states by increasing amounts for each subsequent programming pulse of a programming operation. As a result, the effective gate step for memory cells to be programmed to the L1 data state is 0.3V for each programming pulse, the effective gate step for memory cells to be programmed to the L2 data state is 0.4V for each programming pulse, and the effective gate step for memory cells to be programmed to the L3 data state is 0.5V for each programming pulse. Use of smaller effective gate steps can facilitate tighter threshold voltage distributions, thus facilitating improvements in RWB.

TABLE 2

| Pulse # | Vpgm | ΔVpass L1-L2 | ΔVpass L2 | Vch L1 | Vch L2 | Vch L3 | Eff Gate Step L1 | Eff Gate Step L2 | Eff Gate Step L3 |
|---|---|---|---|---|---|---|---|---|---|
| 1 | 17.0 | 2.0 | 2.0 | 4.0 | 2.0 | 0 | | | |
| 2 | 17.5 | 2.1 | 2.1 | 4.2 | 2.1 | 0 | 0.3 | 0.4 | 0.5 |
| 3 | 18.0 | 2.2 | 2.2 | 4.4 | 2.2 | 0 | 0.3 | 0.4 | 0.5 |
| 4 | 18.5 | 2.3 | 2.3 | 4.6 | 2.3 | 0 | 0.3 | 0.4 | 0.5 |
| 5 | 19.0 | 2.4 | 2.4 | 4.8 | 2.4 | 0 | 0.3 | 0.4 | 0.5 |
| 6 | 19.5 | 2.5 | 2.5 | 5.0 | 2.5 | 0 | 0.3 | 0.4 | 0.5 |
| 7 | 20.0 | 2.6 | 2.6 | 5.2 | 2.6 | 0 | 0.3 | 0.4 | 0.5 |

Although subsequent values for ΔVpass_L1-L2 and ΔVpass_L2 increased by the same amount in the example of Table 2, they could increase by different amounts. In addition, one or more of these voltage level increases (e.g., steps) might decrease for subsequent programming pulses (e.g., each subsequent programming pulse). Through appropriate selection of the differences of these voltage level increases for subsequent programming pulses, e.g., the voltage level increases ΔVpass_L1-L2 and ΔVpass_L2 in the foregoing examples, the effective gate steps for each intermediate data state can be controlled independently. For example, the effective gate step for memory cells to be programmed to the L2 data state might be chosen to be a value less than both the effective gate step for memory cells to be programmed to the L1 data state and the effective gate step for memory cells to be programmed to the L3 data state.

Table 3 provides examples for various voltage levels used in a programming operation of the type described with reference to FIG. 5 in accordance with another embodiment. The example of Table 3 describes seven successive and increasing programming pulses, each programming pulse reaching a program voltage that is 0.5V higher than the program voltage of a preceding (e.g., immediately preceding) programming pulse. For programming pulse #1 (e.g., an initial programming pulse), voltage levels for ΔVpass_L1-L2 and ΔVpass_L2 may be the same at 2.0V, resulting in boosted channel voltages for memory cells to be programmed to the L1, L2 and L3 data states of 4.0V, 2.0V and 0V, respectively. For the embodiment of Table 3, subsequent values for ΔVpass_L1-L2 might decrease relative to a preceding (e.g., immediately preceding) programming pulse, providing decreasing magnitudes of this step of the programming pulses. For example, subsequent values for ΔVpass_L1-L2 might decrease by some particular amount, e.g., 0.1V, for each programming pulse as shown in Table 3, while still boosting the channel voltages for memory cells selected for programming to the L1 data state for each subsequent programming pulse of a programming operation. In addition, subsequent values for ΔVpass_L2 might increase relative to a preceding (e.g., immediately preceding) programming pulse, providing increasing magnitudes of this step of the programming pulses. For example, subsequent values for ΔVpass_L2 might increase by some particular amount, e.g., 0.2V, for each programming pulse as shown in Table 3, thus boosting the channel voltages for memory cells selected for programming to the L1 and L2 data states by increasing amounts for each subsequent programming pulse of a programming operation. As a result, the effective gate step for memory cells to be programmed to the L1 data state is 0.4V for each programming pulse, the effective gate step for memory cells to be programmed to the L2 data state is 0.3V for each programming pulse, and the effective gate step for memory cells to be programmed to the L3 data state is 0.5V for each programming pulse.

TABLE 3

| Pulse # | Vpgm | ΔVpass L1-L2 | ΔVpass L2 | Vch L1 | Vch L2 | Vch L3 | Eff Gate Step L1 | Eff Gate Step L2 | Eff Gate Step L3 |
|---|---|---|---|---|---|---|---|---|---|
| 1 | 17.0 | 2.0 | 2.0 | 4.0 | 2.0 | 0 | | | |
| 2 | 17.5 | 1.9 | 2.2 | 4.1 | 2.2 | 0 | 0.4 | 0.3 | 0.5 |
| 3 | 18.0 | 1.8 | 2.4 | 4.2 | 2.4 | 0 | 0.4 | 0.3 | 0.5 |
| 4 | 18.5 | 1.7 | 2.6 | 4.3 | 2.6 | 0 | 0.4 | 0.3 | 0.5 |
| 5 | 19.0 | 1.6 | 2.8 | 4.4 | 2.8 | 0 | 0.4 | 0.3 | 0.5 |
| 6 | 19.5 | 1.5 | 3.0 | 4.5 | 3.0 | 0 | 0.4 | 0.3 | 0.5 |
| 7 | 20.0 | 1.4 | 3.2 | 4.6 | 3.2 | 0 | 0.4 | 0.3 | 0.5 |

The foregoing examples demonstrated the use of different (e.g., independent) values of effective gate steps for memory cells to be programmed to some of the programmed data states. This can facilitate independent control of the widths of the resulting threshold voltage distributions corresponding to various programmed data states. Furthermore, although different values of effective gate step may be used for each programmed data state, some or all of the intermediate data states, e.g., the L1 and L2 data states in the present example, might use the same values of effective gate step, such as shown in Table 4.

Table 4 provides examples for various voltage levels used in a programming operation of the type described with reference to FIG. 5 in accordance with another embodiment. The example of Table 4 describes seven successive and increasing programming pulses, each programming pulse reaching a program voltage that is 0.5V higher than the program voltage of a preceding (e.g., immediately preceding) programming pulse. For programming pulse #1 (e.g., an initial programming pulse), voltage levels for ΔVpass_L1-L2 and ΔVpass_L2 may be the same at 2.0V, resulting in channel voltages for memory cells to be programmed to the L1, L2 and L3 data states of 4.0V, 2.0V and 0V, respectively. For the embodiment of Table 4, subsequent values for ΔVpass_L2 might increase relative to a preceding (e.g., immediately preceding) programming pulse while values for ΔVpass_L1-L2 might remain the same, thus boosting the channel voltages for memory cells selected for programming to the L1 and L2 data states for each subsequent programming pulse of a programming operation. For example, subsequent values for ΔVpass_L2 might increase by some particular amount, e.g., 0.1V, for each programming pulse as shown in Table 3. As a result, the effective gate step for memory cells to be programmed to the L1 and L2 data states is 0.4V for each programming pulse and the effective gate step for memory cells to be programmed to the L3 data state is 0.5V for each programming pulse.

TABLE 4

| Pulse # | Vpgm | ΔVpass L1-L2 | ΔVpass L2 | Vch L1 | Vch L2 | Vch L3 | Eff Gate Step L1 | Eff Gate Step L2 | Eff Gate Step L3 |
|---|---|---|---|---|---|---|---|---|---|
| 1 | 17.0 | 2.0 | 2.0 | 4.0 | 2.0 | 0 | | | |
| 2 | 17.5 | 2.0 | 2.1 | 4.1 | 2.1 | 0 | 0.4 | 0.4 | 0.5 |
| 3 | 18.0 | 2.0 | 2.2 | 4.2 | 2.2 | 0 | 0.4 | 0.4 | 0.5 |
| 4 | 18.5 | 2.0 | 2.3 | 4.3 | 2.3 | 0 | 0.4 | 0.4 | 0.5 |
| 5 | 19.0 | 2.0 | 2.4 | 4.4 | 2.4 | 0 | 0.4 | 0.4 | 0.5 |
| 6 | 19.5 | 2.0 | 2.5 | 4.5 | 2.5 | 0 | 0.4 | 0.4 | 0.5 |
| 7 | 20.0 | 2.0 | 2.6 | 4.6 | 2.6 | 0 | 0.4 | 0.4 | 0.5 |

Although example embodiments depicted voltage levels for seven successive programming pulses, fewer or more programming pulses might be used. In addition, while specific values of effective gate step were disclosed, it will be apparent that the concepts described herein can be extended to produce a variety of values for effective gate step. Similarly, while specific examples of the initial values of ΔVpass_L1-L2 and ΔVpass_L2, such values will generally be responsive to the chosen definition of target threshold voltages for various data states. Furthermore, the concepts described herein may be applied to memory configured to operate with differing numbers of data states, e.g., three or more data states.

Figure 6:
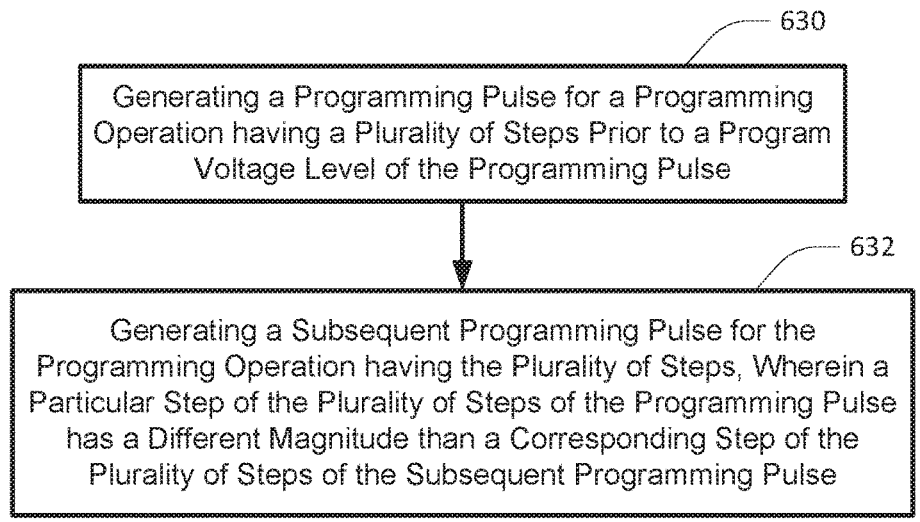
FIG. 6 is a flowchart of a method of operating a memory in accordance with an embodiment.

FIG. 6 is a flowchart of a method of operating a memory (e.g., performing a programming operation) in accordance with an embodiment. At 630, a programming pulse is generated for a programming operation. The programming pulse has a plurality of steps prior to a program voltage level of the programming pulse. As used herein, the steps occurring prior to the program voltage level do not include the step (e.g., final step) to the program voltage level. For example, the programming pulse of FIG. 5 is depicted to have three steps prior to making the transition to the program voltage level at time t6, i.e., the step to voltage level 516 (e.g., between time t1 and time t2, i.e., the step ΔVpass_L0-L1), the step from voltage level 516 to voltage level 518 (e.g., between time t3 and time t4, i.e., the step ΔVpass_L1-L2), and the step from voltage level 518 to voltage level 520 (e.g., between time t5 and time t6, i.e., the step ΔVpass_L2). The number (e.g., integer number) of steps prior to the program voltage level of the programming pulse might generally be described as the number of data states minus one.

Each of the steps of a programming pulse prior to the program voltage level may be thought of as corresponding to one of the data states. For example, the step ΔVpass_L0-

L1 may be thought of as corresponding to the L0 data state as it occurs after transition of BL unsel 502 to the inhibit voltage, the step ΔVpass_L1-L2 may be thought of as corresponding to the L1 data state as it occurs after transition of BL L1 504 to the inhibit voltage, and the step ΔVpass_L2 may be thought of as corresponding to the L2 data state as it occurs after transition of BL L2 506 to the inhibit voltage.

At 632, a subsequent programming pulse is generated for the programming operation. The subsequent programming pulse has the plurality of steps (e.g., the same plurality of steps) prior to a program voltage level of the programming pulse. A particular step of the plurality of steps of the programming pulse has a different magnitude than a corresponding step of the plurality of steps of the subsequent programming pulse. For example, with reference to FIG. 5 and Table 2, the step ΔVpass_L1-L2 for programming pulse #1 is 2.0V and its corresponding step ΔVpass_L1-L2 for programming pulse #2 is 2.1V, i.e., a different magnitude. Similarly, the step ΔVpass_L2 for programming pulse #1 is 2.0V and its corresponding step ΔVpass_L2 for programming pulse #2 is 2.1V, i.e., a different magnitude. While Table 2 uses steps of different magnitude for both steps providing for channel boost of memory cells to be programmed to the L1 and L2 data states, Table 4 shows that some steps of the programming pulse could have the same magnitude from programming pulse to programming pulse. For example, with reference to Table 4, the step ΔVpass_L1-L2 for programming pulse #1 is 2.0V and its corresponding step ΔVpass_L1-L2 for programming pulse #2 is 2.0V, i.e., a same magnitude, while the step ΔVpass_L2 for programming pulse #1 is 2.0V and its corresponding step ΔVpass_L1-L2 for programming pulse #2 is 2.1V, i.e., a different magnitude. A program verify operation may be performed between 630 and 632, as is understood in the art.

The method of FIG. 6 may be extended to different numbers of data states. For some embodiments, steps of the programming pulse prior to the program voltage level and corresponding to each data state between a lower (e.g., lowest) data state and an upper (e.g., highest) data state may each have different magnitudes than their corresponding steps of a different programming pulse. For example, consider a programming operation of an eight-level (e.g., three bits per memory cell) memory device having data states L0-L7, where the L0 data state corresponds to a lower (e.g., lowest) range of threshold voltages, the L7 data state corresponds to an upper (e.g., highest) range of threshold voltages, and the L1-L6 data states correspond to respective increasing ranges of threshold voltages between the range of threshold voltages for the L0 data state and the range of threshold voltages for the L7 data state. In this example, steps of the programming pulse prior to the program voltage level and corresponding to each of the L1-L6 data states might each have a different (e.g., greater or lesser) magnitude than their corresponding steps of a different programming pulse, such that the effective gate step for memory cells to be programmed to each of the data states would be different.

Alternatively, less than all of the data states between the lower data state and the upper data state might have different magnitudes than their corresponding steps of a different programming pulse. To continue with the eight-level memory device example, steps corresponding to the L1, L2, L4 and L5 data states might have a same magnitude from programming pulse to programming pulse, while steps corresponding to the L3 and L6 data states might have different magnitudes from programming pulse to programming pulse. In this manner, the effective gate steps for memory cells to be programmed to the L1, L2 and L3 data states could have one value while the effective gate steps for memory cells to be programmed to the L4, L5 and L6 data states could have a different (e.g., greater or lesser) value. Other combinations can be utilized to produce a variety of different effective gate steps.

Figure 7:
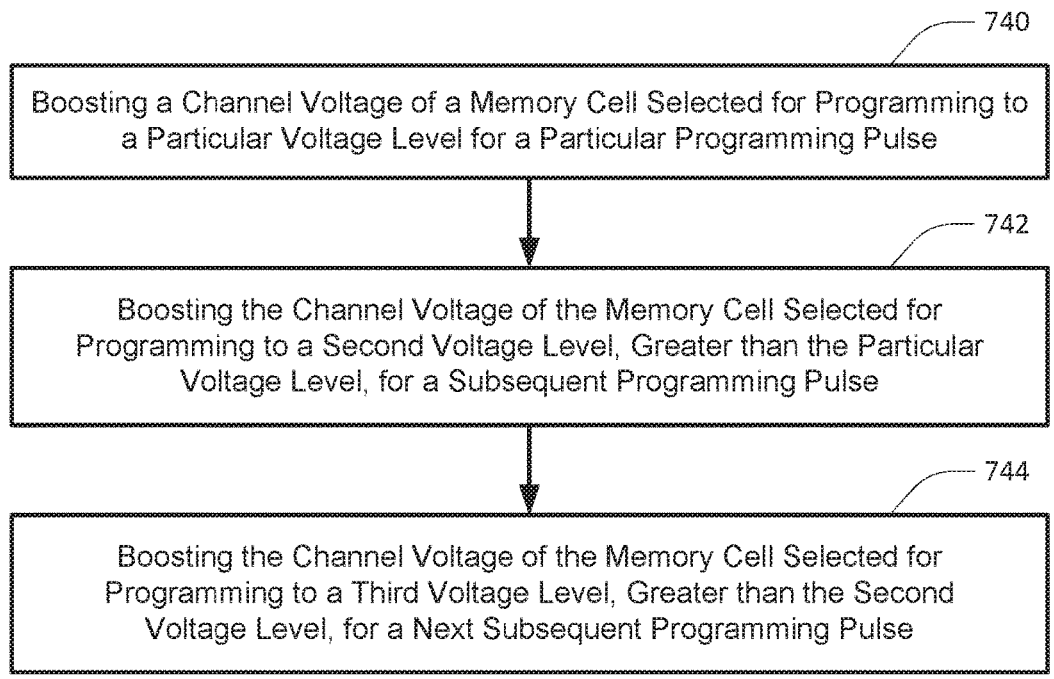
FIG. 7 is a flowchart of a method of operating a memory in accordance with an embodiment.

FIG. 7 is a flowchart of a method of operating a memory (e.g., performing a programming operation) in accordance with an embodiment. At 740, a channel voltage of a memory cell selected for programming is boosted to a particular voltage level for a particular programming pulse. Boosting the channel voltage might be performed as described with reference to FIG. 5. At 742, the channel voltage of the memory cell selected for programming is boosted to a second, greater, voltage level for a subsequent (e.g., immediately subsequent) programming pulse. A program verify operation may be performed between 740 and 742, as is understood in the art. At 744, the channel voltage of the memory cell selected for programming is boosted to a third, greater, voltage level for a next subsequent (e.g., immediately subsequent) programming pulse. A difference between the second voltage level and the particular voltage level and a difference between the third voltage level and the second voltage level may be the same. A program verify operation may be performed between 742 and 744, as is understood in the art.

Figure 8:
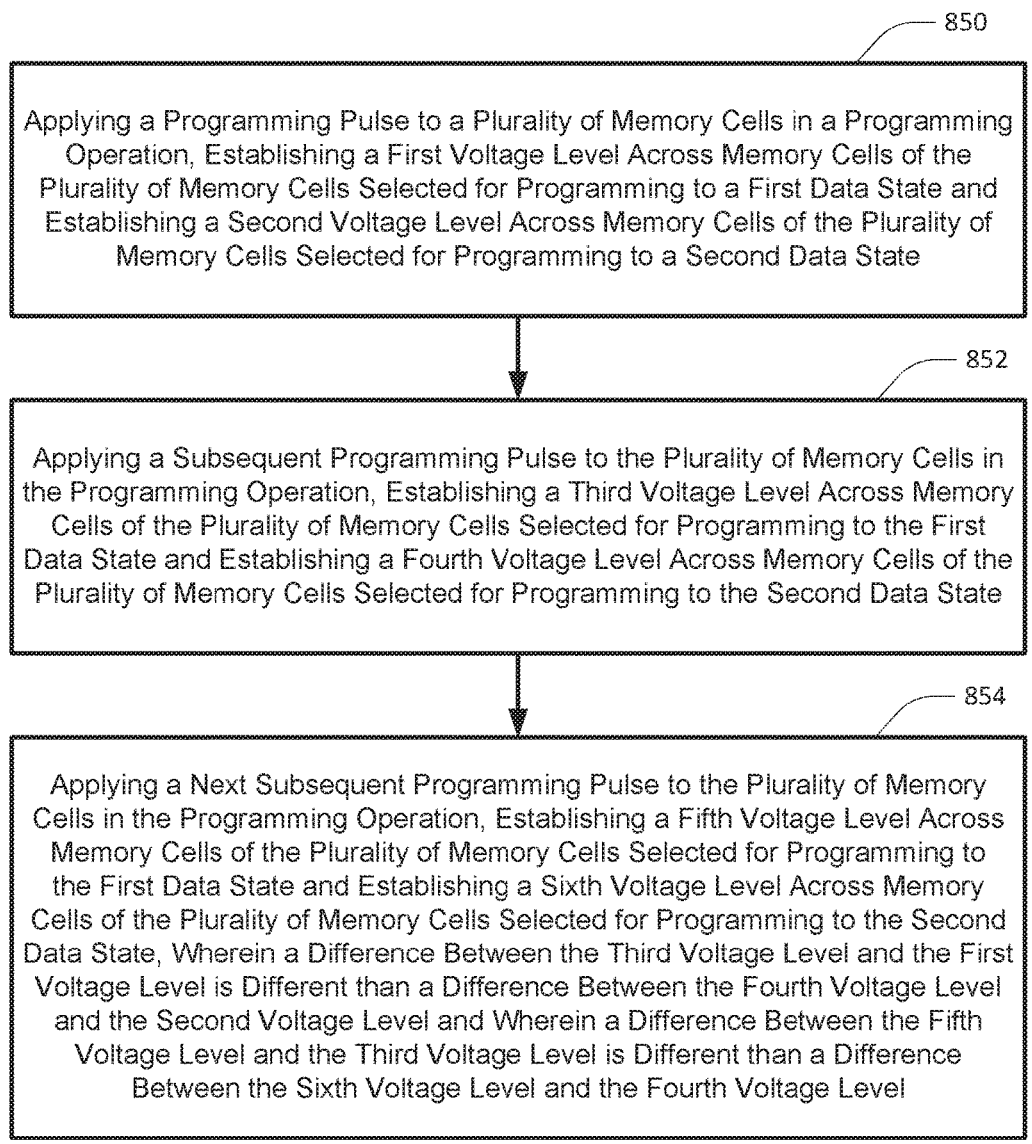
FIG. 8 is a flowchart of a method of operating a memory in accordance with an embodiment.

FIG. 8 is a flowchart of a method of operating a memory (e.g., performing a programming operation) in accordance with an embodiment. At 850, a programming pulse is applied to a plurality of memory cells in a programming operation, establishing (i.e., intending to establish) a first voltage level across (e.g., from control gate to channel) memory cells of the plurality of memory cells selected for programming to a first data state (e.g., using the programming pulse) and establishing a second voltage level across memory cells of the plurality of memory cells selected for programming to a second data state (e.g., using the programming pulse). The first data state may correspond to a range of threshold voltages less than a range of threshold voltages corresponding to the second data state. The second data state may further be an upper (e.g., highest) data state of the plurality of data states that can be programmed in the programming operation. At 852, a subsequent programming pulse is applied to the plurality of memory cells in the programming operation, establishing (i.e., intending to establish) a third voltage level across memory cells of the plurality of memory cells selected for programming to the first data state (e.g., using the subsequent programming pulse) and establishing a fourth voltage level across memory cells of the plurality of memory cells selected for programming to the second data state (e.g., using the subsequent programming pulse). A program verify operation may be performed between 850 and 852, as is understood in the art. The memory cells selected for programming to the first data state and to the second data state may be the same set of memory cells where no memory cell passed the program verify operation between 850 and 852 for the first data state or the second data state.

At 854, a next subsequent programming pulse is applied to the plurality of memory cells in the programming operation, establishing (i.e., intending to establish) a fifth voltage level across memory cells of the plurality of memory cells selected for programming to the first data state (e.g., using the next subsequent programming pulse) and establishing a sixth voltage level across memory cells of the plurality of memory cells selected for programming to the second data state (e.g., using the next subsequent programming pulse). A program verify operation may be performed between 852 and 854, as is understood in the art. The memory cells selected for programming to the first data state and to the second data state may be the same set of memory cells where no memory cell passed the program verify operation between 852 and 854 for the first data state or the second data state. A difference between the third voltage level and the first voltage level and a difference between the fifth voltage level and the third voltage level may be the same, and a difference between the fourth voltage level and the second voltage level and a difference between the sixth voltage level and the fourth voltage level may be the same. The difference between the third voltage level and the first voltage level may be different than (e.g., less than) the difference between the fourth voltage level and the second voltage level. It is noted that the first data state and the second data state of FIG. 8 may refer to two data states of three of more data states of the programming operation.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
generating a programming pulse for a programming operation having a particular number of steps prior to a program voltage level of the programming pulse, the programming pulse to be applied to an access line of an array of memory cells of the memory selected for programming during the programming operation;
generating an additional programming pulse for the programming operation having the particular number of steps, the additional programming pulse to be applied to an access line of the array of memory cells unselected for programming during the programming operation; and
generating a subsequent programming pulse for the programming operation having the particular number of steps prior to a program voltage level of the subsequent programming pulse, the subsequent programming pulse to be applied to the selected access line during the programming operation after applying the programming pulse;
wherein a particular step of the particular number of steps of the programming pulse increases a voltage level of the programming pulse to a particular voltage level, and a corresponding step of the particular number of steps of the additional programming pulse increases a voltage level of the additional programming pulse to the particular voltage level; and
wherein the particular step of the particular number of steps of the programming pulse has a different magnitude than a corresponding step of the particular number of steps of the subsequent programming pulse.

2. The method of claim 1, wherein a different step of the particular number of steps of the programming pulse also has a different magnitude than its corresponding step of the particular number of steps of the subsequent programming pulse.

3. The method of claim 2, wherein an initial step of the particular number of steps of the programming pulse, prior to the particular step of the particular number of steps of the programming pulse and the different step of the particular number of steps of the programming pulse, has a same magnitude as its corresponding step of the particular number of steps of the subsequent programming pulse.

4. The method of claim 3, further comprising:
generating a next subsequent programming pulse for the programming operation having the particular number of steps prior to a program voltage level of the next subsequent programming pulse, the next subsequent programming pulse to be applied to the selected access line during the programming operation after applying the subsequent programming pulse;
wherein the particular step of the particular number of steps of the programming pulse has a first magnitude, its corresponding step of the particular number of steps of the subsequent programming pulse has a second magnitude, and a corresponding step of the particular number of steps of the next subsequent programming pulse has a third magnitude;
wherein the third magnitude is greater than the second magnitude; and
wherein the second magnitude is greater than the first magnitude.

5. The method of claim 4, further comprising:
wherein the different step of the particular number of steps of the programming pulse has a fourth magnitude, its corresponding step of the particular number of steps of the subsequent programming pulse has a fifth magnitude, and a corresponding step of the particular number of steps of the next subsequent programming pulse has a sixth magnitude;
wherein the sixth magnitude is greater than the fifth magnitude; and
wherein the fifth magnitude is greater than the fourth magnitude.

6. The method of claim 5, wherein a difference between the sixth magnitude and the fifth magnitude is equal to a difference between the third magnitude and the second magnitude, and wherein a difference between the fifth magnitude and the fourth magnitude is equal to a difference between the second magnitude and the first magnitude.

7. The method of claim 6, wherein the difference between the sixth magnitude and the fifth magnitude is equal to the difference between the fifth magnitude and the fourth magnitude.

8. The method of claim 1, further comprising performing a program verify operation between generating the programming pulse and generating the subsequent programming pulse.

9. The method of claim 1, further comprising generating the subsequent programming pulse such that the program voltage level of the subsequent programming pulse is higher than the program voltage level of the programming pulse.

10. The method of claim 9, further comprising generating the subsequent programming pulse such that the corresponding step of the particular number of steps of the subsequent programming pulse has a greater magnitude than the particular step of the particular number of steps of the programming pulse.

11. The method of claim 9, further comprising generating the subsequent programming pulse such that the particular step of the particular number of steps of the programming pulse has a greater magnitude than the corresponding step of the particular number of steps of the subsequent programming pulse.

12. The method of claim 1, further comprising:
generating a next subsequent programming pulse for the programming operation having the particular number of steps prior to a program voltage level of the next subsequent programming pulse, the next subsequent programming pulse to be applied to the selected access line during the programming operation after applying the subsequent programming pulse;
wherein the particular step of the particular number of steps of the programming pulse has a first magnitude, the corresponding step of the particular number of steps of the subsequent programming pulse has a second magnitude, and a corresponding step of the particular number of steps of the next subsequent programming pulse has a third magnitude;
wherein the third magnitude is greater than the second magnitude; and
wherein the second magnitude is greater than the first magnitude.

13. The method of claim 1, further comprising:
generating a next subsequent programming pulse for the programming operation having the particular number of steps prior to a program voltage level of the next subsequent programming pulse, the next subsequent programming pulse to be applied to the selected access line during the programming operation after applying the subsequent programming pulse;
wherein the particular step of the particular number of steps of the programming pulse has a first magnitude, the corresponding step of the particular number of steps of the subsequent programming pulse has a second magnitude, and a corresponding step of the particular number of steps of the next subsequent programming pulse has a third magnitude;
wherein the third magnitude is less than the second magnitude; and
wherein the second magnitude is less than the first magnitude.

14. The method of claim 1, wherein a different step of the particular number of steps of the programming pulse has a same magnitude as its corresponding step of the particular number of steps of the subsequent programming pulse.

15. The method of claim 14, wherein an additional step of the particular number of steps of the programming pulse has a same magnitude as its corresponding step of the particular number of steps of the subsequent programming pulse.

16. The method of claim 15, wherein the different step of the particular number of steps of the programming pulse and the additional step of the particular number of steps of the programming pulse each occur prior to the particular step of the particular number of steps of the programming pulse.

17. The method of claim 16, wherein the particular step of the particular number of steps of the programming pulse is a last step of the particular number of steps of the programming pulse prior to the program voltage level of the programming pulse.

18. A method of operating a memory, comprising:
generating a programming pulse for a programming operation having a particular number of steps prior to a program voltage level of the programming pulse, the programming pulse to be applied to an access line of an array of memory cells of the memory selected for programming during the programming operation;
generating an additional programming pulse for the programming operation having the particular number of steps, the additional programing pulse to be applied to an access line of the array of memory cells unselected for programming during the programming operations; and
generating a subsequent programming pulse for the programming operation having the particular number of steps prior to a program voltage level of the subsequent programming pulse, the subsequent programming pulse to be applied to the selected access line during the programming operation after applying the programming pulse;
wherein a particular step of the particular number of steps of the programming pulse increases a voltage level of the programming pulse to a particular voltage level, and a corresponding step of the particular number of steps of the additional programming pulse increases a voltage level of the additional programming pulse to the particular voltage level;
wherein the particular step of the particular number of steps of the programming pulse has a different magnitude than a corresponding step of the particular number of steps of the subsequent programming pulse;
wherein a different step of the particular number of steps of the programming pulse, subsequent to the particular step of the particular number of steps of the programming pulse, also has a different magnitude than its corresponding step of the particular number of steps of the subsequent programming pulse; and
wherein a difference between the magnitude of the particular step of the particular number of steps of the programming pulse and the magnitude of its corresponding step of the particular number of steps of the subsequent programming pulse, and a difference between the magnitude of the different step of the particular number of steps of the programming pulse and the magnitude of its corresponding step of the particular number of steps of the subsequent programming pulse, are a same difference.

19. The method of claim 18, wherein an initial step of the particular number of steps of the programming pulse, prior to the particular step of the particular number of steps of the programming pulse, has a same magnitude as its corresponding step of the particular number of steps of the subsequent programming pulse.

20. The method of claim 19, wherein the different step of the particular number of steps of the programming pulse is a last step of the particular number of steps of the programming pulse prior to the program voltage level of the programming pulse.

21. The method of claim 18, wherein the magnitude of the particular step of the particular number of steps of the programming pulse is less than the magnitude of its corresponding step of the particular number of steps of the subsequent programming pulse.

22. The method of claim 18, further comprising:
generating a next subsequent programming pulse for the programming operation having the particular number of steps prior to a program voltage level of the next subsequent programming pulse, the next subsequent programming pulse to be applied to the selected access line during the programming operation after applying the subsequent programming pulse;
wherein the particular step of the particular number of steps of the programming pulse has a first magnitude, its corresponding step of the particular number of steps of the subsequent programming pulse has a second magnitude, and a corresponding step of the particular number of steps of the next subsequent programming pulse has a third magnitude; and wherein a difference between the first magnitude and the second magnitude equals a difference between the second magnitude and the third magnitude.

23. The method of claim 22, further comprising:

wherein the different step of the particular number of steps of the programming pulse has a fourth magnitude, its corresponding step of the particular number of steps of the subsequent programming pulse has a fifth magnitude, and a corresponding step of the particular number of steps of the next subsequent programming pulse has a sixth magnitude; and wherein a difference between the fourth magnitude and the fifth magnitude equals a difference between the fifth magnitude and the sixth magnitude.

24. A method of operating a memory, comprising:

generating a programming pulse for a programming operation having a particular number of steps prior to a program voltage level of the programming pulse, the programming pulse to be applied to an access line of an array of memory cells of the memory selected for programming during the programming operation;

generating an additional programming pulse for the programming operation having the particular number of steps, the additional programming pulse to be applied to an access line of the array of memory cells unselected for programming during the programming operation; and generating a subsequent programming pulse for the programming operation having the particular number of steps prior to a program voltage level of the subsequent programming pulse, the subsequent programming pulse to be applied to the selected access line during the programming operation after applying the programming pulse to the selected access line;

wherein a particular step of the particular number of steps of the programming pulse increases a voltage level of the programming pulse to a particular voltage level, and a corresponding step of the particular number of steps of the additional programming pulse increases a voltage level of the additional programming pulse to the particular voltage level:

wherein the particular step of the particular number of steps of the programming pulse has a different magnitude than a corresponding step of the particular number of steps of the subsequent programming pulse;

wherein a different step of the particular number of steps of the programming pulse, subsequent to the particular step of the particular number of steps of the programming pulse, also has a different magnitude than its corresponding step of the particular number of steps of the subsequent programming pulse; and wherein the magnitude of the particular step of the particular number of steps of the programming pulse is greater than the magnitude of its corresponding step of the particular number of steps of the subsequent programming pulse, and the magnitude of the different step of the particular number of steps of the programming pulse is less than the magnitude of its corresponding step of the particular number of steps of the subsequent programming pulse.

25. The method of claim 24, further comprising:

wherein a difference between the magnitude of the particular step of the particular number of steps of the programming pulse and the magnitude of its corresponding step of the particular number of steps of the subsequent programming pulse has a first magnitude;

wherein a difference between the magnitude of the different step of the particular number of steps of the programming pulse and the magnitude of its corresponding step of the particular number of steps of the subsequent programming pulse has a second magnitude; and wherein the second magnitude is greater than the first magnitude.

* * * * *